United States Patent
Ito

(10) Patent No.: US 9,059,671 B2
(45) Date of Patent: Jun. 16, 2015

(54) AUTOMATIC GAIN CONTROL DEVICE

(75) Inventor: Keiju Ito, Tokyo (JP)

(73) Assignee: HITACHI KOKUSAI ELECTRIC INC., Tokyo (JP)

( * ) Notice: Subject to any disclaimer, the term of this patent is extended or adjusted under 35 U.S.C. 154(b) by 43 days.

(21) Appl. No.: 14/001,995

(22) PCT Filed: Jan. 12, 2012

(86) PCT No.: PCT/JP2012/050457
§ 371 (c)(1),
(2), (4) Date: Aug. 28, 2013

(87) PCT Pub. No.: WO2012/120917
PCT Pub. Date: Sep. 13, 2012

(65) Prior Publication Data
US 2013/0342276 A1    Dec. 26, 2013

(30) Foreign Application Priority Data
Mar. 4, 2011    (JP) .................. 2011-047641

(51) Int. Cl.
*H03G 3/20*    (2006.01)
*H03G 3/30*    (2006.01)

(52) U.S. Cl.
CPC ............... *H03G 3/20* (2013.01); *H03G 3/3078* (2013.01); *H03G 3/3052* (2013.01)

(58) Field of Classification Search
CPC .............................. H03G 3/30; H03G 3/3036
USPC .................. 330/140, 279; 375/345; 455/234.1
See application file for complete search history.

(56) References Cited

U.S. PATENT DOCUMENTS

2005/0276359 A1* 12/2005 Xiong ........................ 375/345

FOREIGN PATENT DOCUMENTS

| JP | 2002-77101 A | 3/2002 |
|---|---|---|
| JP | 2005-323123 A | 11/2005 |
| JP | 2008-533876 A | 8/2008 |
| WO | 2006/099530 A2 | 9/2006 |

OTHER PUBLICATIONS

International Search Report for PCT/JP2012/050457, Mar. 6, 2012.
Japanese Office Action dated Sep. 30, 2014 issued in a corresponding Japanese application No. 2011-047641.

* cited by examiner

*Primary Examiner* — Steven J Mottola
(74) *Attorney, Agent, or Firm* — Bacon & Thomas, PLLC

(57) ABSTRACT

In an automatic gain control device, an average power detection circuit detects the average power of a received signal in a specific period, a peak to average power ratio calculation circuit calculates a peak to average power ratio value, a threshold calculation circuit obtains the maximum peak to average power ratio (PAPR) so as to determine as a threshold the result of subtracting the value of the PAPR from the full scale value of an A/D converter. A gain control circuit identifies the gain on the basis of the value of the average power and the determined threshold, and a variable gain amplifier amplifies the received signal which is input using the identified gain.

6 Claims, 3 Drawing Sheets

CONFIGURATION OF AUTOMATIC GAIN CONTROL
DEVICE OF PRESENT EMBODIMENT

CONFIGURATION OF AUTOMATIC GAIN CONTROL
DEVICE OF PRESENT EMBODIMENT

PROCESSING OF SECOND METHOD

CONVENTIONAL AUTOMATIC
GAIN CONTROL DEVICE

ANOTHER CONVENTIONAL AUTOMATIC
GAIN CONTROL DEVICE

US 9,059,671 B2

AUTOMATIC GAIN CONTROL DEVICE

FIELD OF THE INVENTION

The present invention relates to an automatic gain control device for controlling a gain of a receiver according to a signal level of a received signal, and more particularly to an automatic gain control device capable of effectively using a dynamic range of an A/D converter regardless of the type of signal and obtaining good reception characteristics.

BACKGROUND OF THE INVENTION

[Description of the Prior Art: FIG. 3]

A conventional automatic gain control device will be described with reference to FIG. 3. FIG. 3 is a block diagram of a conventional automatic gain control device.

As shown in FIG. 3, the conventional automatic gain control device includes a variable gain amplifier 21, an A/D converter 22, an average power detection circuit 23, and a gain control circuit 24.

The variable gain amplifier 21 amplifies an input received signal with a gain controlled by the gain control circuit 24 and outputs the amplified signal.

The A/D converter 22 converts an analog signal to a digital signal.

The average power detection circuit 23 outputs an average power value by detecting an average power of the received signal at a particular time.

The gain control circuit 24 compares the average power value detected by the average power detection circuit 23 to a predetermined threshold and controls the gain of the variable gain amplifier 21 based on the result.

The operation of the conventional automatic gain control device shown in FIG. 3 will be described.

The received signal is amplified with a gain corresponding to a signal level by the variable gain amplifier 21, and the amplified signal is converted into a digital signal by the A/D converter 22. Then, an average power value is calculated by the average power detection circuit 23.

Then, the gain control circuit 24 compares the detected average power value to the threshold and performs the control on the gain for the variable gain amplifier 21 based on the comparison result.

Thus, when controlling the gain based on the average power value, it is necessary to perform the gain control in expectation of peak power in order to prevent the overflow of the A/D converter 22.

For example, in a system using the adaptive modulation, the gain control is performed by a modulation scheme in which a peak to average power ratio (PAPR) is the highest.

Further, in a transmitter, a limiter technique for improving the power efficiency by clipping a peak signal is used and the PAPR varies even in the same modulation scheme. However, when considering the compatibility of the system, the gain control needs to be performed considering the transmitter with a high PAPR.

[Another Conventional Automatic Gain Control Device: FIG. 4]

Next, another conventional automatic gain control device will be described with reference to FIG. 4. FIG. 4 is a block diagram of another conventional automatic gain control device.

As shown in FIG. 4, another conventional automatic gain control device includes a variable gain amplifier 31, an A/D converter 32, a peak power detection circuit 33, and a gain control circuit 34.

The variable gain amplifier 31 and the A/D converter 32 are the same as those shown in FIG. 3.

The peak power detection circuit 33 detects an output of the A/D converter 32, detects a peak power value in a certain monitoring period (span), and outputs the detected value to the gain control circuit 34.

The gain control circuit 34 controls the gain of the variable gain amplifier 31 such that the peak power value is equal to a full scale (maximum input level which is not saturated) in the A/D converter 32.

The operation of another conventional automatic gain control device shown in FIG. 4 will be described.

The received signal is amplified with a gain corresponding to a signal level by the variable gain amplifier 31 and the amplified signal is converted into a digital signal by the A/D converter 32. The peak power value of a certain period is detected by the peak power detection circuit 33.

Then, the gain control circuit 34 controls the gain of the variable gain amplifier 31 such that the detected peak power value is equal to the full scale of the A/D converter 32.

Thus, when controlling the gain by detecting the peak of the signal level of the certain monitoring period, the dynamic range of the A/D converter can be effectively utilized, but it is hard to respond to a momentary increase in signal level, and overflow occurs if a large signal level is inputted instantaneously.

[Related Art]

As a technique relating to AGC (Automatic Gain Control), there is Japanese Patent Application Publication No. 2002-77101 (Hitachi Kokusai Electronic Inc., Patent Document 1).

Patent Document 1 discloses an OFDM (Orthogonal Frequency Division Multiplexing) signal receiver which calculates an average power of a received signal, compares the average power to a reference voltage, controls the gain of the AGC on the basis of the comparison result, and performs switching by selecting one of reference voltages on the basis of the length of the effective symbol period of the OFDM signal.

[Patent Document 1] Japanese Patent Application Publication No. 2002-77101

However, in the conventional automatic gain control device which controls the gain based on the average power, the PAPR of the received signal is expected in advance, and the gain is set to avoid the overflow of the A/D converter. Accordingly, if the PAPR of the received signal is smaller than the expected PAPR, the dynamic range of the A/D converter cannot be fully utilized and the influence of the noise of the A/D converter increases. On the contrary, if the PAPR of the received signal is greater than the expected PAPR, there is a problem in that the A/D converter overflows and the reception characteristics are degraded.

Further, in the conventional automatic gain control device which controls the gain based on the peak power, in order to control the gain according to the peak power that constantly changes, it is necessary to appropriately set the threshold or the control period. Therefore, it is quite difficult in practice, and there is a problem in that the overflow in the A/D converter occurs frequently, and the reception characteristics are degraded.

SUMMARY OF THE INVENTION

In view of the above, the present invention provides an automatic gain control device capable of effectively using a dynamic range of an A/D converter, suppressing the occurrence of the overflow, and obtaining good reception characteristics.

The present invention for solving the problems of the conventional example, an automatic gain control device which amplifies a received signal with a gain corresponding to a signal level, the automatic gain control device including: an A/D converter configured to convert the amplified signal as an analog signal into a digital signal; an average power detection unit configured to receive the signal from the A/D converter and detect an average power of the received signal in a specific period and an instantaneous power to average power ratio calculation circuit configured to receive the digital signal from the A/D converter and the average power from the average power detection unit and calculate an instantaneous power to average power ratio.

The automatic gain control device further include: a threshold calculation unit configured to calculate, as a peak to average power ratio (PAPR), a maximum value among plurality of instantaneous power to average power ratios inputted in a certain period, and determine, as a threshold, a value obtained by subtracting the PAPR from a full scale of the A/D converter; a gain control unit configured to compare the average power to the calculated threshold, and determine a gain based on the comparison result; and a variable gain amplifier configured to amplify the received signal inputted by using the determined gain.

The automatic gain control device, wherein instead of determining the threshold by obtaining the PAPR and subtracting the PAPR from the full scale of the A/D converter, the threshold calculation unit stores specific probability that is determined in advance to have negligible effect on a reception error even when an overflow occurs in the A/D converter, calculates an instantaneous power to average power ratio corresponding to the specific probability based on a probability density of the plurality of instantaneous power to average power ratios inputted in a certain period, and determines, as the threshold, a value obtained by subtracting the calculated instantaneous power to average power ratio corresponding to the specific probability from the full scale of the A/D converter.

EFFECTS OF THE INVENTION

In accordance with the present invention, there is provided an automatic gain control device which amplifies a received signal with a gain corresponding to a signal level, the automatic gain control device including: an A/D converter which converts the amplified signal that is an analog signal into a digital signal; an average power detection unit which inputs the signal from the A/D converter and detects an average power of the received signal in a specific period and an instantaneous power to average power ratio calculation circuit which inputs the signal from the A/D converter and the average power from the average power detection unit.

The automatic gain control device further include calculates an instantaneous power to average power ratio; a threshold calculation unit which calculates, as a peak to average power ratio (PAPR), a maximum value among a plurality of instantaneous power to average power ratios inputted in a certain period and determines, as a threshold, a value obtained by subtracting the PAPR from a full scale of the A/D converter; a gain control unit which compares the average power to the determined threshold, and determines a gain based on the comparison result; and a variable gain amplifier which amplifies the received signal that is inputted with the determined gain.

Accordingly, it is possible to perform the gain control according to both the average power and the peak power by a simple process.

There are effects of reducing the occurrence of overflow regardless of the type of signal to effectively use the dynamic range of the A/D converter and reducing the influence of noise to improve the reception quality.

Further, in accordance with the present invention, instead of determining the threshold by obtaining the PAPR and subtracting the PAPR from the full scale of the A/D converter, the threshold calculation unit stores specific probability that is determined in advance to have negligible effect on a reception error even when an overflow occurs in the A/D converter, calculates an instantaneous power to average power ratio corresponding to the specific probability based on a probability density of the plurality of instantaneous power to average power ratios inputted in a certain period, and determines, as a threshold, a value obtained by subtracting the calculated instantaneous power to average power ratio corresponding to the specific probability from the full scale of the A/D converter.

Accordingly, by ignoring the instantaneous power at which the frequency of occurrence is low such that it has little impact on the entire received signal, it is possible to more efficiently use the dynamic range of the A/D converter, and improve the reception quality.

DETAILED DESCRIPTION OF THE EMBODIMENTS

[Summary of the Embodiment]

An embodiment of the present invention will be described with reference to the drawings. In an automatic gain control device in accordance with an embodiment of the present invention, a received signal amplified by a variable gain amplifier is converted into a digital signal by an A/D converter, and an average power detection circuit detects an average power of the received signal by using the digital signal. An instantaneous power to average power ratio calculation circuit calculates an instantaneous power to average power ratio. A threshold calculation circuit obtains a maximum value (PAPR) among inputted instantaneous power to average power ratios and determines the value obtained by subtracting the PAPR from a full scale of the A/D converter as a threshold. A gain control circuit compares the average power value to the determined threshold to determine the gain in the variable gain amplifier.

Accordingly, it is possible to perform the gain control according to both the average power and the peak power by a simple process; and it is possible to prevent the occurrence of overflow regardless of the type of signal, effectively use the dynamic range of the A/D converter, and improve the reception quality.

Further, in the automatic gain control device in accordance with the embodiment of the present invention, the threshold calculation circuit obtains the instantaneous power to average power ratio corresponding to specific probability at which the effect on the reception error set in advance is negligible from the probability density of the instantaneous power to the average power, and determines, as a threshold, the value obtained by subtracting the instantaneous power to average power ratio from the full scale of the A/D converter. Therefore it is possible to calculate the threshold by using the instantaneous power to average power ratio corresponding to the probability, which does not affect the reception error, and reduce the occurrence of overflow, regardless of the type of signal. Also, it is possible to more efficiently use the dynamic range of the A/D converter and improve the reception quality.

Figure 1:
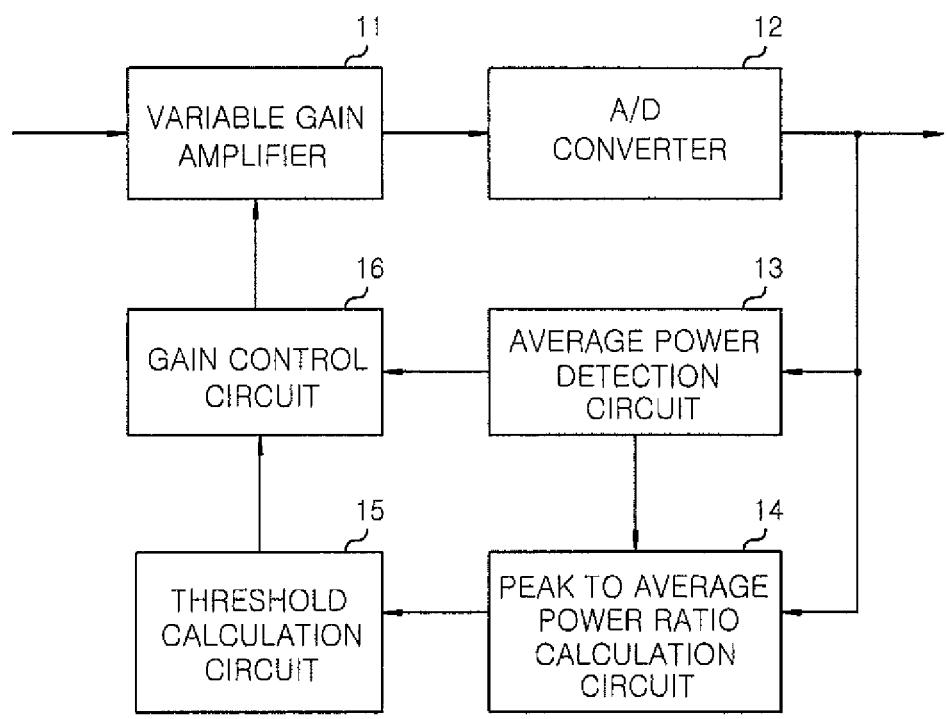
FIG. 1 is a block diagram of an automatic gain control device in accordance with an embodiment of the present invention.

[Automatic Gain Control Device in Accordance with the Embodiment: FIG. 1]

A configuration of an automatic gain control device in accordance with the embodiment of the present invention will be described with reference to FIG. 1. FIG. 1 is a block diagram of the automatic gain control device in accordance with the embodiment of the present invention.

As shown in FIG. 1, the automatic gain control device (present device) in accordance with the embodiment of the present invention includes a variable gain amplifier 11, an ND converter 12, an average power detection circuit 13, an instantaneous power to average power ratio calculation circuit 14, a threshold calculation circuit 15, and a gain control circuit 16. Each component will be described.

The variable gain amplifier 11 amplifies an input received signal with a gain controlled by the gain control circuit 16 and outputs the amplified signal. The variable gain amplifier 11 corresponds to a variable gain amplifier in the claims.

The A/D converter 12 converts an analog signal, which is the amplified received signal into a digital signal.

The average power detection circuit 13 detects an average power value of the received signal in a certain period from the digital signal and outputs the detected value. The average power detection circuit 13 corresponds to an average power detection unit in the claims.

The instantaneous power to average power ratio calculation circuit 14 calculates and regularly outputs an instantaneous power to average power ratio of the received signal on the basis of the digital signal from A/D converter 12 and the average power value from the average power detection circuit 13. The instantaneous power to average power ratio calculation circuit 14 corresponds to an instantaneous power to average power ratio calculation unit in the claims.

The threshold calculation circuit 15, serving as a feature of the present device, calculates a threshold of the average power as a reference of the gain control in the gain control circuit 16 and sets the threshold in the gain control circuit 16. The threshold calculation circuit 15 will be later described in detail. The threshold calculation circuit 15 corresponds to a threshold calculation unit in the claims.

The gain control circuit 16 performs control by comparing the set threshold to the average power value inputted from the average power detection circuit 13 and determining the gain of the variable gain amplifier 11 based on the comparison result. The gain control circuit 16 corresponds to a gain control unit in the claims.

A digital circuitry portion of the configuration includes a digital signal processor DSP (Digital Signal Processing) or the like.

[Threshold Calculation Circuit 15]

The threshold calculation circuit 15, serving as the feature of the present device, will be described.

The threshold calculation circuit 15 calculates a threshold from the instantaneous power to average power ratio inputted from the instantaneous power to average power ratio calculation circuit 14 and the full scale of the A/D converter 12, and updates the threshold of the gain control circuit 16.

Specifically, e.g., the threshold calculation circuit 15 stores the instantaneous power to average power ratios inputted from the instantaneous power to average power ratio calculation circuit 14 in a certain period.

Accordingly, the threshold calculation circuit 15 obtains a plurality of (m) instantaneous power to average power ratios (s1, s2, s3, . . . , sm) within the certain period.

The threshold calculation circuit 15 calculates the threshold using the plurality of instantaneous power to average power ratios. Herein, there are two calculation methods.

The threshold calculation methods in the threshold calculation circuit 15 will be described.

[Threshold Calculation Method 1]

First, the first threshold calculation method will be described.

The threshold calculation circuit 15 determines the peak to average power ratio (PAPR) among m instantaneous power to average power ratios (s1, s2, s3, . . . , sm) and sets this value as y(dB).

Further, the full scale of the A/D converter 12 is set as x(dBm).

Then, the threshold calculation circuit 15 calculates x-y, determines x-y(dBm) as a threshold and outputs it to the gain control circuit 16.

The first threshold calculation method is performed in this manner.

In the first threshold calculation method, by a simple process using the peak to average power ratio (PAPR), it is possible to set the threshold of the gain control to avoid the overflow even though the peak power corresponding to the PAPR is inputted. Accordingly, it is possible to prevent the overflow of the A/D converter 12, effectively use the dynamic range, suppress the influence of noise, and obtain a good signal-to-noise ratio.

[Threshold Calculation Method 2]

Next, a second threshold calculation method will be described.

The second method is intended more efficiently use the dynamic range of the A/D converter 12 by ignoring instantaneous powers occurring at a negligibly low frequency considering the probability.

First, the threshold calculation circuit 15 sorts the m instantaneous power to average power ratios (s1, s2, s3, . . . , sm) which are inputted within a certain period in the order of magnitude.

Then, on the basis of the sorted instantaneous power to average power ratios, the instantaneous power to average power ratio corresponding to specific probability α %, which is determined in advance to have negligible effect on a reception error even when an overflow occurs in the A/D converter 12, is obtained. The value of specific probability is stored in advance in the threshold calculation circuit 15.

For example, when the instantaneous power to average power ratios are arranged in descending order, the instantaneous power to average power ratio corresponding to the probability α % is the m×α/100-th largest data, which is y(dB).

This process is intended to obtain the instantaneous power to average power ratio with specific probability negligible in a probability density function of the instantaneous power to average power ratio.

Then, the threshold calculation circuit 15 determines x-y (dBm) as a threshold by subtracting the instantaneous power to average power ratio corresponding to the probability of occurrence of α % from the full scale x(dBm) of the A/D converter 12 and outputs it to the gain control circuit 16.

The probability density function of the instantaneous power to average power ratio corresponding to the probability α % is calculated by a complementary cumulative distribution function (CCDF) curve, which is a graph wherein a horizontal axis represents the instantaneous power to average power ratio dB and a vertical axis represents the probability (%) at which the instantaneous power to average power ratio is equal to or greater than the corresponding instantaneous power to average power ratio. After obtaining the probability density function, the instantaneous power to average power ratio corresponding to the probability α % may be calculated by using this function. However, as described above, the instantaneous power to average power ratio corresponding to specific probability α % in the probability density function can be obtained by a simple process.

Further, the specific probability is probability that can be regarded to have little effect on the reception error even if this signal cannot be received due to the overflow of the A/D converter 12, and this probability is α %. The value of α varies depending on the system, and is obtained in advance by simulation or the like and stored in the threshold calculation circuit 15.

That is, since the frequencies of the signals of the probability α % from the larger side of the instantaneous power to average power value is extremely low, the effect on the entire received signal can be ignored even if this signal cannot be received due to the overflow. The threshold is calculated by using the maximum instantaneous power to average power ratio excluding it.

In the second threshold calculation method, the instantaneous power to average power ratio with probability that can be regarded to have little effect on the reception error set in advance is obtained based on the probability density of the plurality of instantaneous power to average power ratios, and the value obtained by subtracting the instantaneous power to average power ratio from the full scale of the A/D converter is set as a threshold. By ignoring the instantaneous power at which the frequency of occurrence is small such that it has no impact on the reception error even through the overflow occurs, it is possible to more efficiently use the dynamic range of the A/D converter, suppress the influence of noise, and obtain a good signal-to-noise ratio.

Figure 2:
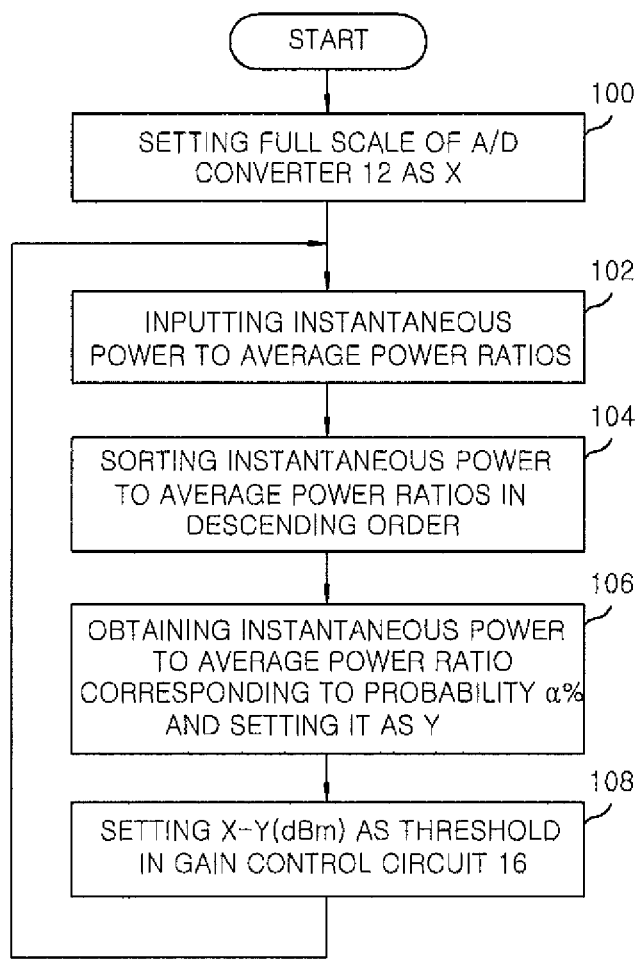
FIG. 2 is a flowchart illustrating a process of a second method in a threshold calculation unit.
Figure 3:
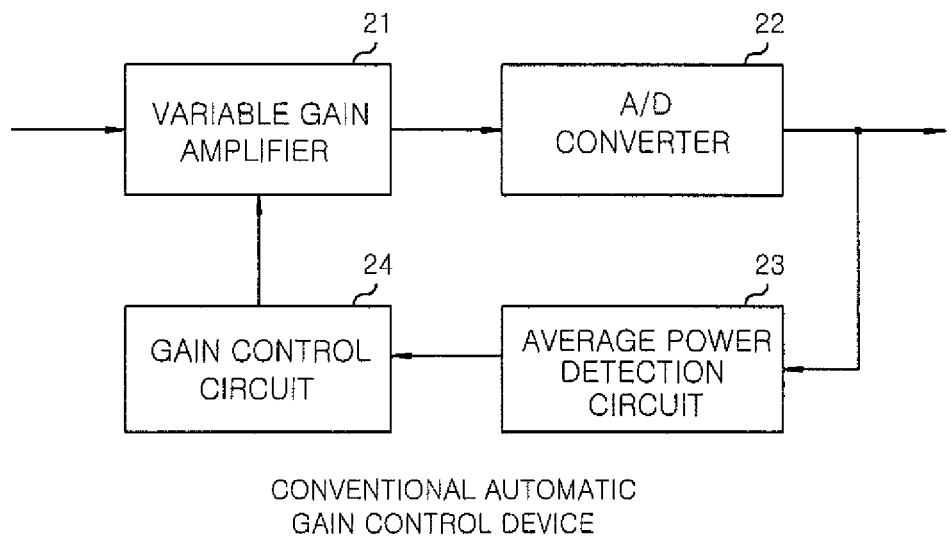
FIG. 3 is a block diagram of a conventional automatic gain control device.
Figure 4:
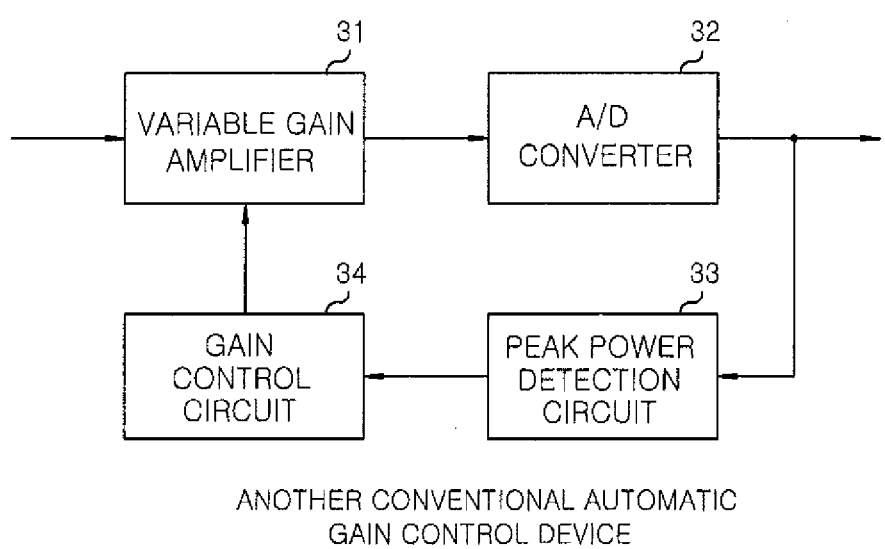
FIG. 4 is a block diagram of another conventional automatic gain control device.

[Processing of the Second Method in the Threshold Calculation Circuit 15: FIG. 2]

Next, processing of the second method in the threshold calculation circuit 15 will be described with reference to FIG. 2. FIG. 2 is a flowchart illustrating the process of the second method in the threshold calculation unit.

As shown in FIG. 2, the threshold calculation circuit 15 sets the full scale dBm of the A/D converter 12 as x (100), and the instantaneous power to average power ratio of the received signal calculated based on the digital signal for the A/D converter 12 and the average power value for the average power detection circuit 13, is inputted thereto from the instantaneous power to average power ratio calculation circuit 14 (102).

The threshold calculation circuit 15 sorts the inputted m instantaneous power to average power ratios in descending order (104), reads the m×α/100-th largest instantaneous power to average power ratio corresponding to the probability α %, and sets the instantaneous power to average power ratio as y(dB) (106). This process corresponds to a process of obtaining the instantaneous power to average power ratio corresponding to the probability α % based on the probability density of the instantaneous power to average power ratio.

Then, the threshold calculation circuit 15 calculates x-y (dBm) and it is set as a threshold in the gain control circuit 16 (108).

In this way, the process in the threshold calculation circuit 15 is performed.

Further, instead of the process 104, the threshold calculation circuit 15 may obtain the probability density function based on the inputted m instantaneous power to average power ratios and obtain the instantaneous power to average power ratio corresponding to the probability α % based on the probability density function.

[Gain Control Circuit 16]

Next, the gain control in the gain control circuit 16 will be described.

The gain control circuit 16 compares the average power value from the average power detection circuit 13 to the set threshold, and controls the gain of the variable gain amplifier 11.

Specifically, when the average power value of the received signal is P(dBm) and if the value of P-(x-y) is positive, the gain is excessively large, and the gain control circuit 16 performs control to reduce the gain by P-(x-y) (dB).

If the value of P-(x-y) is negative, generally, the gain control circuit 16 does not perform the control of the gain, but may perform control to increase the gain depending on the system.

Further, in practice, it is desirable to prevent the operation from becoming unstable by giving a hysteresis to the threshold when decreasing the gain and the threshold when increasing the gain. For example, it may be considered that the threshold when increasing the gain is a threshold of the standards set from the threshold calculation circuit 15, and the threshold when decreasing the gain is smaller than that theory.

[Effects of the Embodiment]

According to the automatic gain control device in accordance with the embodiment of the present invention, the received signal amplified by the variable gain amplifier 11 is converted into a digital signal by the A/D converter 12, and the average power detection circuit 13 detects the average power value of a certain period by using the digital signal. The instantaneous power to average power ratio calculation circuit 14 calculates the instantaneous power to average power ratio, and the threshold calculation circuit 15 sets the value x-y(dBm) obtained by subtracting the peak to average power ratio (PAPR) y(dB) among the instantaneous power to average power ratios inputted in a certain period from the instantaneous power to average power ratio calculation circuit 14 from the full scale x(dBm) of the A/D converter 12, as a threshold, in the gain control circuit 16. The gain control circuit 16 compares the average power value from the average power detection circuit 13 to the set threshold to control the gain in the variable gain amplifier 11. Accordingly, it is possible to perform the gain control according to both the average power and the peak power by a simple process, and there are effects of reducing the occurrence of overflow regardless of the type of signal, effectively using the dynamic range of the A/D converter 12, reducing the influence of noise, and improving the reception quality.

Further, according to the automatic gain control device in accordance with the embodiment of the present invention, the threshold calculation circuit 15 stores the probability α % that can be regarded to have little effect on the reception error in advance, sorts the m instantaneous power to average power ratios inputted in a certain period in descending order, reads the m×α/100-th largest instantaneous power to average power ratio y(dB), and sets the value x-y(dBm) obtained by subtracting it from the full scale x(dBm) of the A/D converter 12, as a threshold, in the gain control circuit 16. The gain control circuit 16 compares the average power value from the average power detection circuit 13 to the set threshold and controls the gain in the variable gain amplifier 11. By ignoring the instantaneous power at which the frequency of occurrence is small, such that it has no impact on the reception error even though the overflow occurs, it is possible to more efficiently use the dynamic range of the A/D converter 12, reduce the influence of noise, and improve the reception quality.

Further, in this embodiment, the average power detection circuit 13, the instantaneous power to average power ratio calculation circuit 14, the threshold calculation circuit 15, and the gain control circuit 16 are implemented by a digital circuit, but may be constituted by an analog circuit.

The present invention is suitable for an automatic gain control device capable of effectively using a dynamic range of the A/D converter regardless of the type of signal and obtaining good reception characteristics.

What is claimed is:

1. An automatic gain control device which amplifies a received signal with a gain corresponding to a signal level, the automatic gain control device comprising:
   an A/D converter configured to convert the amplified signal as an analog signal into a digital signal;
   an average power detection unit configured to receive the digital signal from the A/D converter and detect an average power of the received signal in a specific period;
   an instantaneous power to average power ratio calculation circuit configured to receive the digital signal from the A/D converter and the average power from the average power detection unit and calculate an instantaneous power to average power ratio;
   a threshold calculation unit configured to calculate a threshold based on a plurality of instantaneous power to average power ratios inputted in a certain period;
   a gain control unit configured to compare the average power to the calculated threshold and determine a gain based on the comparison result; and
   a variable gain amplifier configured to amplify the received signal inputted by using the determined gain.

2. The automatic gain control device of claim 1, wherein the threshold calculation unit stores a specific probability referring to ignoring instantaneous power peaks having low frequency of occurrence and negligible effect on a reception error even when an overflow occurs in the A/D converter, calculates an instantaneous power to average power ratio corresponding to the specific probability based on a probability density of the plurality of instantaneous power to average power ratios inputted in the certain period, and determines, as the threshold, a value obtained by subtracting the calculated instantaneous power to average power ratio corresponding to the specific probability from a full scale of the A/D converter.

3. The automatic gain control device of claim 1, wherein the threshold calculation unit is configured to calculate, as a peak to average power ratio (PAPR), a maximum value among the plurality of instantaneous power to average power ratios inputted in the certain period, and determine, as the threshold, a value obtained by subtracting the PAPR from a full scale of the A/D converter.

4. An automatic gain control method for amplifying a received signal with a gain corresponding to a signal level, comprising:
   converting the amplified signal as an analog signal into a digital signal;
   detecting an average power of the received signal in a specific period based on the digital signal;
   calculating an instantaneous power to average power ratio based on the digital signal and the detected average power;
   calculating a threshold based on a plurality of instantaneous power to average power ratios calculated for a certain period;
   comparing the average power to the calculated threshold and determining a gain based on the comparison result; and
   amplifying the received signal by the determined gain.

5. The automatic gain control method of claim 4, wherein said calculating the threshold includes storing a specific probability referring to ignoring instantaneous power peaks having low frequency of occurrence and negligible effect on a reception error even when an overflow occurs; calculating an instantaneous power to average power ratio corresponding to the specific probability based on a probability density of the plurality of instantaneous power to average power ratios calculated for the certain period; and determining, as the threshold, a value obtained by subtracting the calculated instantaneous power to average power ratio corresponding to the specific probability from a full scale of an A/D converter employed in converting the amplified signal.

6. The automatic gain control method of claim 4, wherein said calculating the threshold includes calculating, as a peak to average power ratio (PAPR), a maximum value among the plurality of instantaneous power to average power ratios calculated for the certain period, and determining, as the threshold, a value obtained by subtracting the PAPR from a full scale at a time when the analog signal is converted into the digital signal.

* * * * *